US012191165B2

(12) United States Patent
Wei

(10) Patent No.: US 12,191,165 B2
(45) Date of Patent: Jan. 7, 2025

(54) WAFER TRANSFER SYSTEM AND METHOD OF USE

(71) Applicant: TAIWAN SEMICONDUCTOR MANUFACTURING COMPANY LIMITED, Hsin-Chu (TW)

(72) Inventor: Kai-Chin Wei, Zhubei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 526 days.

(21) Appl. No.: 17/502,736

(22) Filed: Oct. 15, 2021

(65) Prior Publication Data

US 2022/0301893 A1 Sep. 22, 2022

Related U.S. Application Data

(60) Provisional application No. 63/163,715, filed on Mar. 19, 2021.

(51) Int. Cl.
*H01L 21/67* (2006.01)
*C23C 16/458* (2006.01)
*H01L 21/677* (2006.01)

(52) U.S. Cl.
CPC ...... *H01L 21/67017* (2013.01); *C23C 16/458* (2013.01); *H01L 21/67748* (2013.01)

(58) Field of Classification Search
CPC ............. H01L 21/67017; C23C 16/458; G02L 21/67748
USPC ................................................ 454/184, 187
See application file for complete search history.

(56) References Cited

U.S. PATENT DOCUMENTS

| 9,214,364 | B2* | 12/2015 | Dobashi | C23C 16/45574 |
| 10,512,948 | B2* | 12/2019 | Iwamoto | B08B 5/02 |
| 2017/0067159 | A1* | 3/2017 | Isobe | C23C 16/45525 |
| 2018/0151347 | A1* | 5/2018 | Hanashima | C23C 16/45527 |
| 2019/0385867 | A1* | 12/2019 | Sugita | H01L 21/02041 |
| 2021/0276873 | A1* | 9/2021 | Kim | C01B 32/186 |
| 2021/0292892 | A1* | 9/2021 | Hirano | C23C 16/52 |
| 2022/0081770 | A1* | 3/2022 | Takebayashi | C23C 16/08 |
| 2022/0259736 | A1* | 8/2022 | Igarashi | C23C 16/4412 |
| 2022/0298642 | A1* | 9/2022 | Sato | C23C 16/45591 |

FOREIGN PATENT DOCUMENTS

CN 210837677 U * 6/2020 ......... H01L 21/0206

* cited by examiner

*Primary Examiner* — Avinash A Savani
*Assistant Examiner* — Dana K Tighe
(74) *Attorney, Agent, or Firm* — Cooper Legal Group, LLC

(57) ABSTRACT

A wafer transfer system includes a transfer chamber defining a volume. The transfer chamber includes a wafer support within the volume to support a wafer. A first input gas nozzle is disposed above the wafer support and inputs a first flow of gas into the transfer chamber at a first flow speed. A second input gas nozzle is disposed below the wafer support and inputs a second flow of gas into the transfer chamber at a second flow speed different than the first flow speed. A first output gas structure guides the gas from the transfer chamber due to the second flow speed being different than the first flow speed such that suspended particles within the transfer chamber are at least one of directed away from the wafer support or directed toward the first output gas structure to guide the suspended particles from the transfer chamber.

20 Claims, 13 Drawing Sheets

WAFER TRANSFER SYSTEM AND METHOD OF USE

RELATED APPLICATIONS

This application claims priority to U.S. Provisional Application 63/163,715, titled "WAFER TRANSFER SYSTEM AND METHOD OF USE" and filed on Mar. 19, 2021, which is incorporated herein by reference.

BACKGROUND

Generally, wafer processing, such as wafer processing during semiconductor fabrication, utilizes one or more process chambers. For example, a wafer may be transferred into a process chamber with a transfer module, also known as a load lock module or load lock, and operated on within the process chamber such as to add, remove, treat, etc. one or more layers on the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
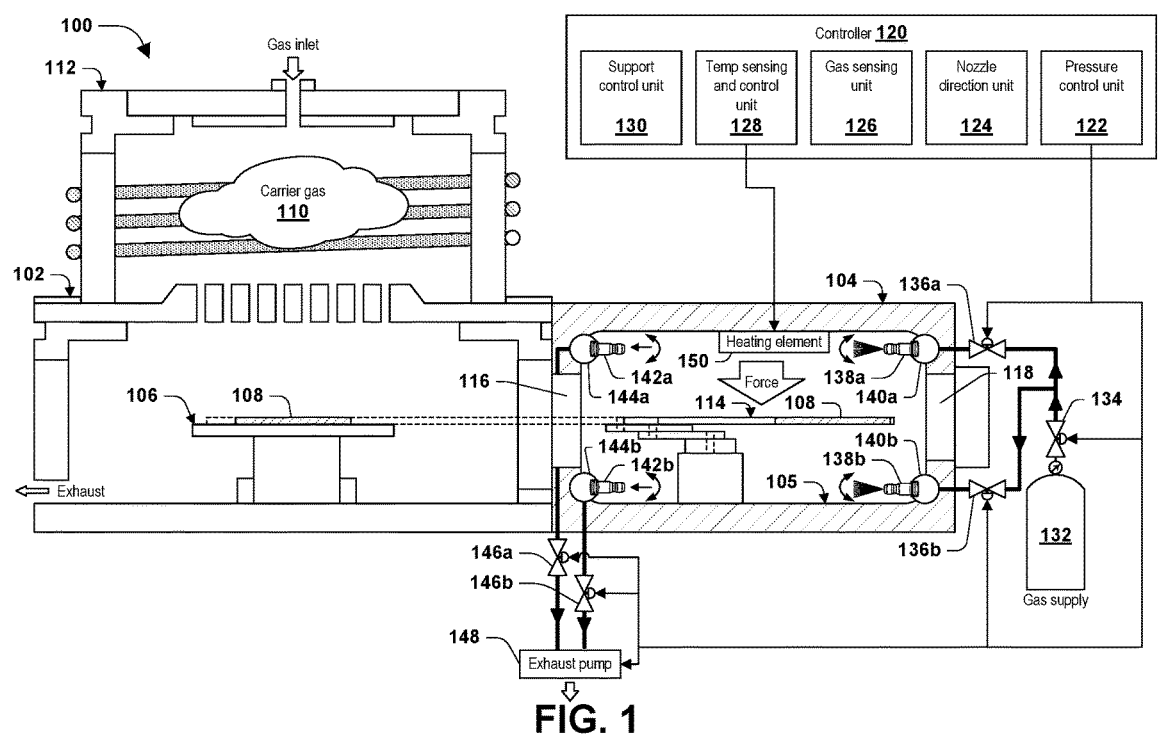
FIG. 1 is a schematic illustration of a wafer transfer system for transferring a wafer, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

A wafer transfer system and method, such as including a load lock module, and method of using, operating, etc. are provided. According to some embodiments, the wafer transfer system provides a particle (PA) shield, such as by developing an air/gas channel within a transfer chamber of the system. Particle (PA) protection is provided to a wafer during transfer of the wafer, such as in a load lock module, to fabrication equipment during semiconductor manufacturing. The wafer, such as a semiconductor wafer, is processed to develop semiconductor devices thereon/therefrom which are used in a multitude of electronic devices, such as mobile phones, laptops, desktops, tablets, watches, gaming systems, and various other industrial, commercial, and consumer electronics. A semiconductor wafer generally undergoes one or more treatments to produce desired semiconductor devices, features, etc. The wafer is transferred in a transfer chamber, such as within a load lock module, between different pieces of semiconductor fabrication equipment as the wafer undergoes semiconductor processing or manufacturing. According to some embodiments, one or more gas nozzles or structures provide a gas shield around the wafer in a wafer container, such as a transfer chamber of a wafer load lock module. The gas shield surrounds the wafer while the wafer is transferred between different pieces of semiconductor fabrication equipment. The one or more gas nozzles or structures guide gas within the transfer chamber away from the wafer. The gas may contain particles, which are also guided away from the wafer. An air supply system and/or a controller provide different angles of the air nozzles and/or air flow speeds through the nozzles to create the air shield. The air shield mitigates contact between particles and the wafer and/or serves to evacuate particles from the system/module. Mitigating contact between particles and the wafer and/or evacuating particles is desirable because the particles can contaminate the wafer and adversely affect the operation, reliability, etc. of devices formed in/on the wafer and thereby reduce yield, increase costs, etc.

FIG. 1 is a schematic illustration of a wafer transfer system 100 for transferring a wafer, according to some embodiments. For example, the wafer transfer system 100 comprises a processing chamber 102 connected to a load lock module 104. The processing chamber 102 includes a stage 106 to support a wafer 108, such as a semiconductor wafer, for processing. The processing chamber 102 may be any type of wafer processing chamber that provides wafer processing, such as wet clean processing (e.g., cleaning by solvents such as acetone, trichloroethylene and ultrapure water), surface passivation, photolithography, ion implantation (e.g., embedding dopants in regions of the wafer 108), etching (e.g., dry etching, plasma etching, reactive-ion etching (RIE), atomic layer etching (ALE), buffered oxide etching), plasma ashing, thermal treatments (e.g., rapid thermal anneal, furnace anneals, thermal oxidation), vapor deposition (e.g., chemical vapor deposition (CVD), atomic layer deposition (ALD), physical vapor deposition (PVD)), molecular beam epitaxy (MBE), electrochemical deposition (ECD), chemical-mechanical polishing (CMP), etc. The processing chamber 102 may also be a wafer transfer tool, such as a cluster tool, that transfers the wafer 108 into another processing chamber or another component of a processing chamber. The processing chamber 102 may be a front opening unified pod (FOUP), which is an enclosure configured to hold a plurality of wafers in a controlled environment and to facilitate transfer to other processing or measurement equipment. According to an example, the processing chamber 102 is shown as a CVD chamber that receives source reactive materials and carrier gas 110 from an ancillary processing chamber 112 for processing the wafer 108.

In some embodiments, the load lock module 104 is configured to mechanically transfer the wafer 108 into and out of the processing chamber 102, to generally approximate conditions within the processing chamber 102, to mitigate introduction of media, such as dust, moisture, condensation, contaminants, etc., into the processing chamber 102, and/or to reduce loss of processing materials used to process the wafer 108 within the processing chamber. The load lock module 104 includes a transfer chamber 105 defining a volume. The transfer chamber includes a wafer support 114 within the volume to support the wafer 108. The wafer support 114 may be configured as a robotic arm to transfer the wafer 108 into and/or out of the processing chamber 102. For example, the wafer support 114 may place the wafer 108 onto the stage 106 of the processing chamber 102 and/or retrieve the wafer 108 from the stage 106 of the processing chamber 102. In an example, the processing chamber 102 may include a robotic arm to transfer the wafer 108 from a structure, such as a stage or the wafer support 114, within the load lock module 104. In an example, the load lock module 104 includes the wafer support 114 configured as a cassette or carousel for storing and/or transferring a plurality of wafers including the wafer 108. The load lock module 104 includes a first load port 116, such as including an insulated and retractable door, to facilitate transfer of the wafer 108 and to insulate the transfer chamber 105 of the load lock module 104 from exterior conditions. In an example, the load lock module includes a second load port 118 to facilitate transfer of the wafer 108, such as transfer to a second processing chamber (not shown). During transfer of the wafer 108, the wafer support 114 passes through the first load port 116 of the load lock module 104 and a first load port of the processing chamber 102.

In some embodiments, the environment and operation of the load lock module 104 is controlled by a controller 120. According to some embodiments, the controller 120 includes a pressure control unit 122, a nozzle direction unit 124, a gas sensing unit 126, a temperature sensing and control unit 128, and/or a support control unit 130. In some embodiments, the pressure control unit 122 changes and/or maintains pressure within the transfer chamber 105 of the load lock module 104. The pressure control unit 122 may change pressure within the transfer chamber 105 in accordance with pressure within the processing chamber 102. The transfer chamber 105 may be associated with an atmospheric pressure, such as a standard atmosphere (1 atm). Pressure within the transfer chamber 105 may be changed to facilitate transfer to the processing chamber 102. In an example where the processing chamber 102 provides atmospheric pressure CVD (APCVD), the transfer chamber 105 may be maintained at 1 atm. In an example where the processing chamber 102 provides low-pressure CVD (LPCVD), such as thermal oxide deposition, the transfer chamber 105 may be reduced to sub-atmospheric pressures, such as in range from $10^{-4}$ Torr to 1 Torr. In an example where the processing chamber 102 provides ultrahigh vacuum CVD (UHVCVD), the transfer chamber 105 may be reduced to a very low pressure, such as below $10^{-8}$ Torr. In an example where the processing chamber 102 provides sub-atmospheric CVD (SACVD), the transfer chamber 105 may be increased and/or maintained above 30 Torr, such as between 100-600 Torr. In an example, the load lock module 104 is ventilated with Nitrogen gas to ambient pressure or a small overpressure during transfer of the wafer 108 into and/or out of the load lock module 104.

In some embodiments, the pressure control unit 122 regulates pressure within the transfer chamber 105 by controlling a supply of gas from a gas supply unit 132. Gas from the gas supply unit 132 flows through a pressure valve 134 and then through a plurality of conduits, such as pneumatic hoses, to a first input nozzle valve 136a and/or a second input nozzle valve 136b. The first input nozzle valve 136a communicates gas through a conduit, such as a pneumatic hose, to a first input gas nozzle 138a, which is housed in a first input nozzle assembly 140a. Likewise, the second input nozzle valve 136b communicates gas through a conduit, such as a pneumatic hose, to a second input gas nozzle 138b, which is housed in a second input nozzle assembly 140b. In an example, the first input gas nozzle 138a directs a first flow of gas above the wafer support 114 and the second input gas nozzle 138b directs a second flow of gas below the wafer support 114. Gas from within the transfer chamber 105 is guided out of the transfer chamber 105 by a first output gas nozzle 142a, which is housed in a first output nozzle assembly 144a. Gas from within the transfer chamber 105 is also guided out of the transfer chamber 105 by a second output gas nozzle 142b, which is housed in a second output nozzle assembly 144b. In an example, the first output gas nozzle 142a guides the first flow of gas above the wafer support 114 and the second output gas nozzle 142b guides the second flow of gas below the wafer support 114. Gas is suctioned from the first output gas nozzle 142a, thorough a conduit, such as a pneumatic hose, connected to a first output nozzle valve 146a by an exhaust pump 148. Gas is also suctioned from the second output gas nozzle 142b, thorough a conduit, such as a pneumatic hose, connected to a second output nozzle valve 146b by the exhaust pump 148 and/or a different exhaust pump (not shown).

According to some embodiments, the pressure control unit 122 controls the exhaust pump 148 and/or at least one of the first output nozzle valve 146a or the second output nozzle valve 146b to create a vacuum environment within the transfer chamber 105 by way of suction of gas through at least one of the first output gas nozzle 142a or the second output gas nozzle 142b. For example, upon introduction of the wafer 108 into the load lock module 104, the environment within the transfer chamber 105 may be changed or maintained to a transfer chamber pressure in accordance with pressure of the processing chamber 102, such as APCVD, LPCVD, UHVCVD, or SACVD, as set forth above. In some embodiments, the pressure control unit 122 controls the pressure valve 134, the first input nozzle valve 136a, and the second input nozzle valve 136b in closed positions to not introduce gas into the transfer chamber 105 until a predetermined transfer chamber pressure is reached. The pressure control unit 122 may control the first output nozzle valve 146a to open less than the second output nozzle valve 146b to create a first flow speed of the first flow of gas less than a second flow speed of the second flow of gas through suction of existing gas from the transfer chamber 105. In some embodiments, the pressure control unit 122 controls the pressure valve 134, the first input nozzle valve 136a, and the second input nozzle valve 136b in open positions less than at least one of the first output nozzle valve 146a or the second output nozzle valve 146b. The first flow of gas and the second flow of gas are simultaneously created and/or maintained within the transfer chamber 105 while the transfer chamber pressure is changed through suction of existing gas from the transfer chamber 105 at a rate greater than introduction of gas into the transfer chamber 105. In some embodiments, the pressure control unit 122 provides a cleaning cycle by creating turbulent air within the transfer chamber 105 by dynamically changing gas flow through the first input nozzle valve 136a, the second input nozzle valve 136b, the first output nozzle valve 146a, and/or the second output nozzle valve 146b. The turbulent air may entrain media within gas inside the transfer chamber 105, which is in turn suctioned through the first output gas nozzle 142a and the second output gas nozzle 142b at a rate greater than introduction of gas into the transfer chamber 105. For example, a cleaning cycle may be initiated by the pressure control unit 122 periodically and/or before introduction of the wafer 108 into the transfer chamber 105 to remove contaminants from the volume defined within the transfer chamber. In an example, a cleaning cycle may be initiated with the wafer 108 disposed on the wafer support 114 before and/or after processing of the wafer 108 by the processing chamber 102.

According to some embodiments, the first input gas nozzle 138a and the first output gas nozzle 142a form a first set of gas nozzles disposed above the wafer support 114 within the transfer chamber 105. In some embodiments, the first set of gas nozzles provides a laminar flow of gas above the wafer support 114 in layers, such that each layer moves smoothly past adjacent layers with little to no mixing. According to some embodiments, the second input gas nozzle 138b and the second output gas nozzle 142b form a second set of gas nozzles disposed below the wafer support 114 within the transfer chamber 105. In some embodiments, the second set of gas nozzles provides a laminar flow of gas below the wafer support 114 in layers, such that each layer moves smoothly past adjacent layers with little to no mixing.

In some embodiments, the pressure control unit 122 of the controller 120 regulates the pressure valve 134 and/or the first input nozzle valve 136a to control a flow speed of the gas supplied by the gas supply unit 132 to the first input gas nozzle 138a. The pressure control unit 122 of the controller 120 regulates the pressure valve 134 and/or the first input nozzle valve 136a to control a first flow speed of the first flow of gas input into the transfer chamber 105 by the first input gas nozzle 138a. According to some embodiments, the first flow speed of the first flow of gas input into the transfer chamber 105 corresponds to the first flow speed of the first flow of gas above the wafer support 114. In some embodiments, the pressure control unit 122 of the controller 120 regulates the pressure valve 134 and/or the second input nozzle valve 136b to control a flow speed of the gas supplied by the gas supply unit 132 to the second input gas nozzle 138b. The pressure control unit 122 of the controller 120 regulates the pressure valve 134 and/or the second input nozzle valve 136b to control a second flow speed of the second flow of gas input into the transfer chamber 105 by the second input gas nozzle 138b. According to some embodiments, the second flow speed of the second flow of gas input into the transfer chamber 105 corresponds to the second flow speed of the second flow of gas below the wafer support 114. According to some embodiments, the pressure control unit 122 of the controller 120 regulates the first input nozzle valve 136a and/or the second input nozzle valve 136b such that the first flow speed of the first flow of gas is less than the second flow speed of the second flow of gas. When gas moves faster, pressure of the moving gas decreases. When the first flow speed of the first flow of gas, such as above the wafer support 114, is less than the second flow speed of the second flow of gas, such as below the wafer support 114, a downforce, also known as downward air pressure or negative lift, is created within the transfer chamber 105. The downforce directs media, such as dust, moisture, condensation, contaminants, etc. downward and away from the wafer support 114 and/or the wafer 108. The downforce also inhibits dislodging of the wafer 108 from the wafer support 114.

The downforce within the transfer chamber 105 follows Bernoulli's principle, which states that an increase in speed of a fluid, such as the second flow speed of the second flow of gas greater than the first flow speed of the first flow of gas, occurs simultaneously with a decrease in static pressure or a decrease in the fluid's potential energy. Bernoulli's principle is summarized in equation 1, as follows:

$$P + pgh + \tfrac{1}{2} \cdot pv^2 = \text{constant} \qquad \text{Equation 1}$$

where P is fluid pressure, p is fluid density, g is the acceleration due to gravity, h is the height of elevation, and v is fluid velocity. Thus, if the speed of a fluid decreases not due to an elevation difference, then the decrease in speed is due to an increase in static pressure that is resisting the fluid flow. In other words, an increase in speed v is accompanied by a simultaneous decrease in pressure P in order for the sum to add up to the same constant number. Thus, an increase in the second flow speed of the second flow of gas greater than the first flow speed of the first flow of gas within the transfer chamber 105 creates a downforce within the transfer chamber 105.

In some embodiments, the temperature sensing and control unit 128 controls temperature within the transfer chamber 105 to facilitate transfer of the wafer 108 to the processing chamber 102. The temperature sensing and control unit 128 communicates with a heating element 150 to control a temperature of the gas supplied by the gas supply unit 132. The temperature sensing and control unit 128 communicates with the heating element 150 to control a temperature of the first flow of gas input into the transfer chamber 105 by the first input gas nozzle 138a. In an example where the processing chamber 102 provides atmospheric pressure CVD (APCVD), the transfer chamber 105 may be changed or maintained above 100° C., such as between 600 and 800° C. In an example where the processing chamber 102 provides low-pressure CVD (LPCVD), the transfer chamber 105 may be changed or maintained greater than ambient room temperature (i.e., 15 to 25° C.), such as between 125 and 250° C. In an example where the processing chamber 102 provides ultrahigh vacuum CVD (UHVCVD), the transfer chamber 105 may be changed or maintained above 500° C., such as between 500 and 600° C. In an example where the processing chamber 102 provides sub-atmospheric CVD (SACVD), the transfer chamber 105 may be changed and/or maintained above 300° C., such as between 350 and 500° C. In some embodiments, the temperature sensing and control unit 128 controls a temperature of the wafer 108 itself to facilitate transfer of the wafer 108 with the processing chamber 102. Temperature of the wafer 108 may be changed in accordance with processing within the processing chamber 102. In an example, the heating element 150 is an infra-red heating element that directs infra-red radiation towards the wafer 108 for absorption and heating thereof. Other arrangements and/or configurations of the load lock module 104, the controller 120, the heating element 150, and/or the gas supply unit 132 are within the scope of the present disclosure.

Figure 2A:
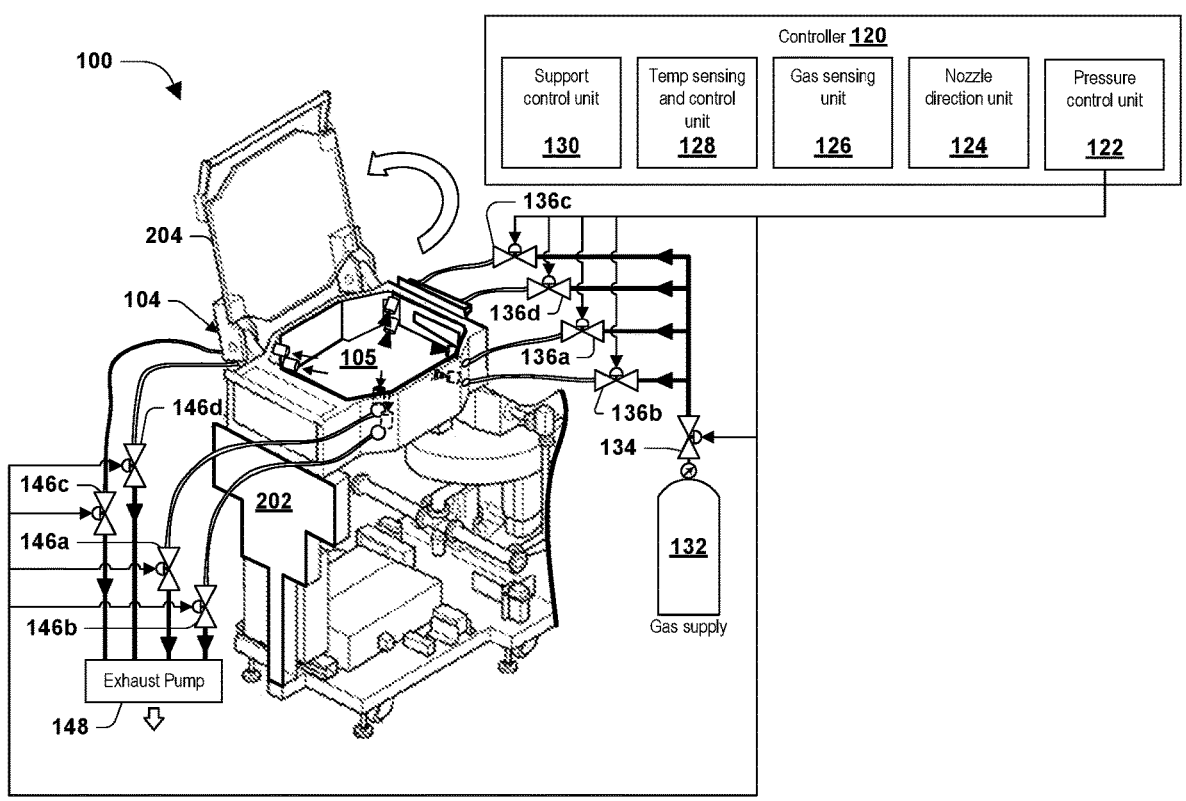
FIG. 2A is a schematic illustration of a wafer transfer system including a load lock module for transferring a wafer and FIG. 2B is an enhanced illustration of the load lock module of FIG. 2A, according to some embodiments.
Figure 2B:
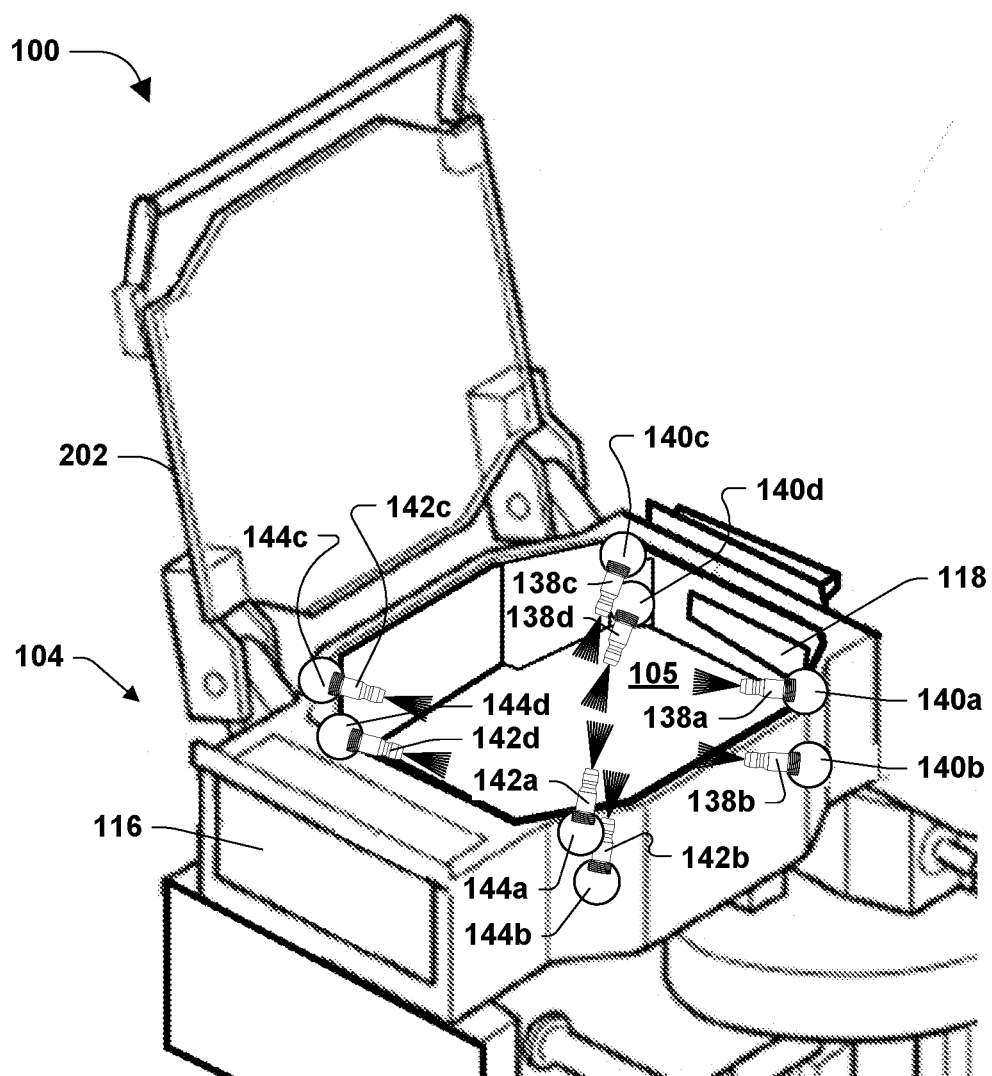

FIG. 2A is a schematic illustration of the wafer transfer system 100 for transferring a wafer and FIG. 2B is an enhanced illustration of the load lock module 104 of FIG. 2A, according to some embodiments. The wafer transfer system 100 is illustrated without the wafer support 114 for clarity. The wafer transfer system 100 is configured as a portable transfer system that may be arranged for connection to various processing equipment, such as the processing chamber 102 of FIG. 1. The wafer transfer system 100 includes a cart structure 202 that may support and contain various components, such as the controller 120, the gas supply unit 132, the exhaust pump 148, valves, and/or conduits, which are illustrated in an exploded view for clarity. The load lock module 104 includes a door 204 that may be opened for manual insertion of a wafer, such as the wafer 108, and/or configuration of internal components.

As illustrated in FIGS. 2A and 2B, gas from the gas supply unit 132 flows through the pressure valve 134 and then through a plurality of conduits, such as pneumatic hoses, to a third input nozzle valve 136c and a fourth input nozzle valve 136d. The third input nozzle valve 136c communicates gas through a conduit, such as a pneumatic hose, to a third input gas nozzle 138c, which is housed in a third input nozzle assembly 140c. The fourth input nozzle valve 136d communicates gas through a conduit, such as a pneumatic hose, to a fourth input gas nozzle 138d, which is housed in a fourth input nozzle assembly 140d. In an example, the third input gas nozzle 138c directs a third flow of gas above the wafer support 114 (not shown) and the fourth input gas nozzle 138d directs a fourth flow of gas below the wafer support 114 (not shown). Gas from within the transfer chamber 105 is guided out of the transfer chamber 105 by a third output gas nozzle 142c, which is housed in a third output nozzle assembly 144c. Gas from within the transfer chamber 105 is guided out of the transfer chamber 105 by a fourth output gas nozzle 142d, which is housed in a fourth output nozzle assembly 144d. In an example, the third output gas nozzle 142c guides the third flow of gas above the wafer support 114 (not shown) and the fourth output gas nozzle 142d guides the fourth flow of gas below the wafer support 114 (not shown). Gas is suctioned from the third output gas nozzle 142c thorough a conduit, such as a pneumatic hose, to a third output nozzle valve 146c, and then through a conduit, such as a pneumatic hose, connected to the exhaust pump 148. Gas is suctioned from the fourth output gas nozzle 142d through a conduit, such as a pneumatic hose, to a fourth output nozzle valve 146d, and then through a conduit, such as a pneumatic hose, connected to the exhaust pump 148. In some embodiments, each of the input nozzle valves 136a-d controls a corresponding input flow speed of gas through a corresponding input gas nozzle and each of the output nozzle valves 146a-d controls a corresponding output flow speed of gas through a corresponding output gas nozzle in response to control by the pressure control unit 122. For example, the first input nozzle valve 136a controls a first input flow speed, the second input nozzle valve 136b controls a second input flow speed, the third input nozzle valve 136c controls a third input flow speed, and the fourth input nozzle valve 136d controls a fourth input flow speed. For example, the first output nozzle valve 146a controls a first output flow speed, the second output nozzle valve 146b controls a second output flow speed, the third output nozzle valve 146c controls a third output flow speed, and the fourth output nozzle valve 146d controls a fourth output flow speed. Other arrangements and/or configurations of the input nozzle valves 136a-d and/or the output nozzle valves 146a-d are within the scope of the present disclosure.

In an example, the third input gas nozzle 138c and the third output gas nozzle 142c form a third set of gas nozzles disposed above the wafer support 114 (not shown) within the transfer chamber 105. In some embodiments, the third set of gas nozzles provides a laminar flow of gas above the wafer support 114 (not shown) in layers, such that each layer moves smoothly past adjacent layers with little to no mixing. According to some embodiments, the fourth input gas nozzle 138d and the fourth output gas nozzle 142d form a fourth set of gas nozzles disposed below the wafer support 114 (not shown) within the transfer chamber 105. In some embodiments, the fourth set of gas nozzles provides a laminar flow of gas below the wafer support 114 (not shown) in layers, such that each layer moves smoothly past adjacent layers with little to no mixing. Other arrangements and/or configurations of the input gas nozzles, the input nozzle valves, the output gas nozzles, and/or the output nozzle valves are within the scope of the present disclosure.

Figure 3:
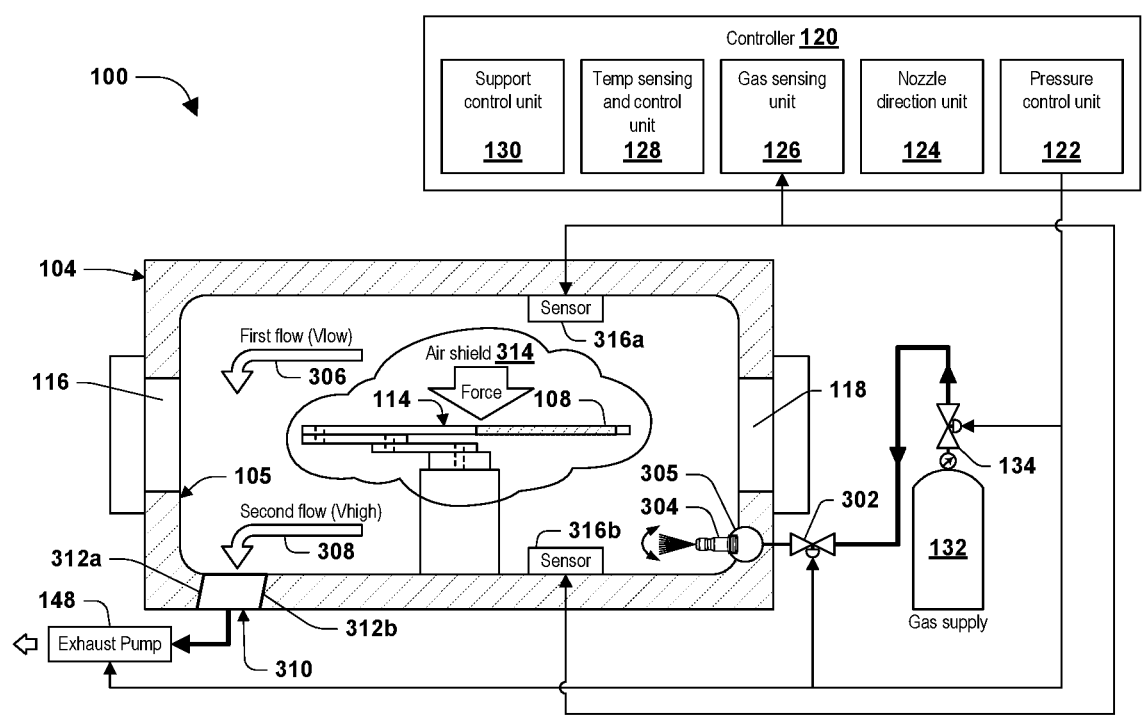
FIG. 3 is a schematic illustration of a wafer transfer system for transferring a wafer, according to some embodiments.

FIG. 3 is a schematic illustration of the wafer transfer system 100 for transferring a wafer, according to some embodiments. The pressure control unit 122 of the controller 120 regulates the pressure valve 134 and/or an input nozzle valve 302 to control a flow speed of the gas supplied by the gas supply unit 132 to an input gas nozzle 304, which is housed in an input nozzle assembly 305. The pressure control unit 122 of the controller 120 regulates the pressure valve 134 and/or the input nozzle valve 302 to control a first flow speed of a first flow of gas 306 within the transfer chamber 105 and/or a second flow speed of a second flow of gas 308. Gas from within the transfer chamber 105 is guided out of the transfer chamber 105 by an output gas structure 310 and suctioned by the exhaust pump 148. In an embodiment, the output gas structure 310 is a geometric structure having a first sidewall 312a and a second sidewall 312b. For example, the first sidewall 312a and the second sidewall 312b are angled toward the wafer support 114 to facilitate laminar airflow of the first flow of gas 306 and the second flow of gas 308. In an embodiment, the output gas structure 310 includes a plurality of baffles, also known as diverters or chutes, to direct a channel of laminar airflow out of the transfer chamber 105. An air shield 314 and a downforce are created around the wafer support 114 and the wafer 108 by the first flow of gas 306 and/or the second flow of gas 308 to direct particles, media, contaminants, etc. away from the wafer support 114 and the wafer 108, and is thus at times referred to as a PA shield. A physical arrangement of the input gas nozzle 304 and the output gas structure 310 within the transfer chamber 105 and below the wafer support 114 promotes the first flow speed of the first flow of gas 306 to be less than the second flow speed of the second flow of gas 308. Other arrangements and/or configurations of the input gas nozzle 304 and/or the output gas structure 310 are within the scope of the present disclosure.

According to some embodiments, the gas sensing unit 126 communicates with a first pressure sensor 316a and/or a second pressure sensor 316b, disposed within the transfer chamber 105. The first pressure sensor 316a and/or the second pressure sensor 316b measure at least one of the first flow speed of the first flow of gas 306, the second flow speed of the second flow of gas 308, or the transfer chamber pressure within the transfer chamber 105. In an example, the first pressure sensor 316a and/or the second pressure sensor 316b includes a Pirani heat loss gauge and/or an atmospheric reference gauge to measure the transfer chamber pressure and to provide a set-point control signal once a vacuum pressure between the load lock module 104 and the processing chamber 102 is equalized. A Pirani heat loss gauge may be configured as a thin metal wire, such as Nickel, suspended in a tube connected to the transfer chamber 105. The thin metal wire may change in electrical potential across a Wheatstone bridge circuit in response to transfer chamber pressure, which in turn is communicated to the gas sensing unit 126. In an example, the first pressure sensor 316a and/or the second pressure sensor 316b may be configured as a micro-electro-mechanical system (MEMS) Pirani vacuum transducer. A gauge sensor may offer advantages over an absolute sensor in vacuum environments because the transfer chamber pressure may be more accurately equalized to zero differential pressure between the transfer chamber 105 and ambient pressure independently of variation in barometric ambient pressure due to changes in weather conditions. In an example, the first pressure sensor 316a and/or the second pressure sensor 316b includes a capacitance manometer to measure absolute or relative pressure within the transfer chamber 105. In an example, the first pressure sensor 316a and/or the second pressure sensor 316b includes a Pirani gauge and a capacitance monometer. A Pirani gauge may read about 60% higher than a capacitance manometer in the presence of water vapor, such that the difference in measurement may be detected by the gas sensing unit 126 and communicated to the pressure control unit 122 to regulate introduction of a reactively neutral gas into the transfer chamber 105, such as Helium, Nitrogen, and/or Argon. Other arrangements and/or configurations of the first pressure sensor 316a and/or the second pressure sensor 316b are within the scope of the present disclosure.

Figure 4A:
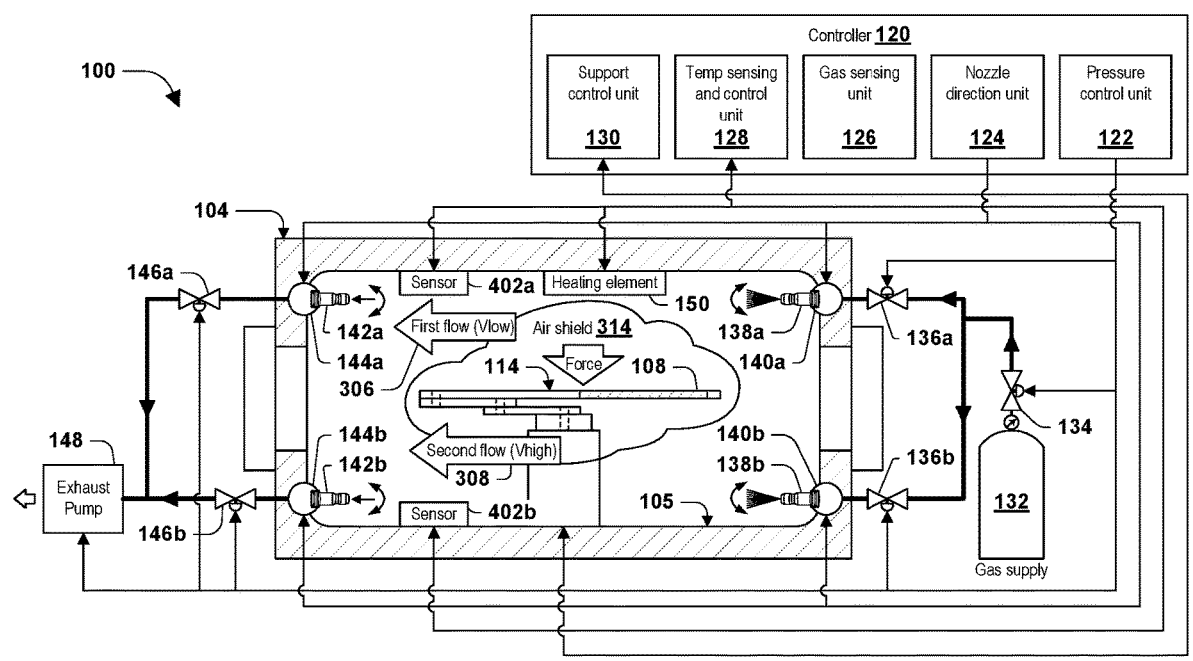
FIGS. 4A-4C are schematic illustrations of a wafer transfer system for transferring a wafer, according to some embodiments.
Figure 4B:
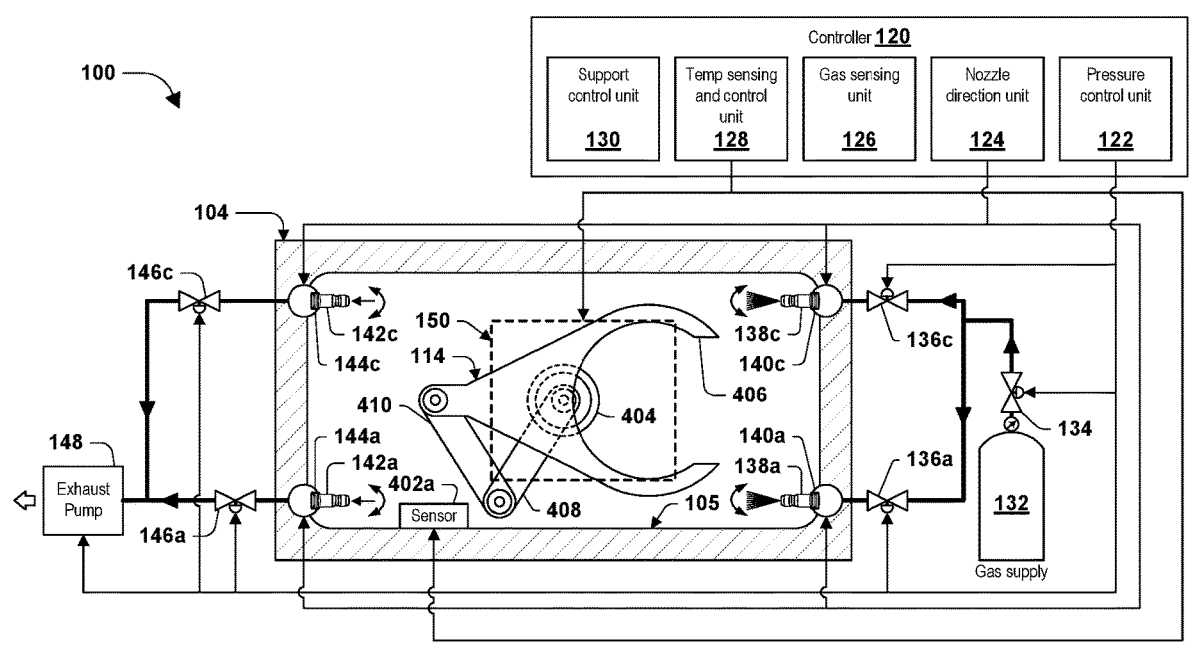
Figure 4C:
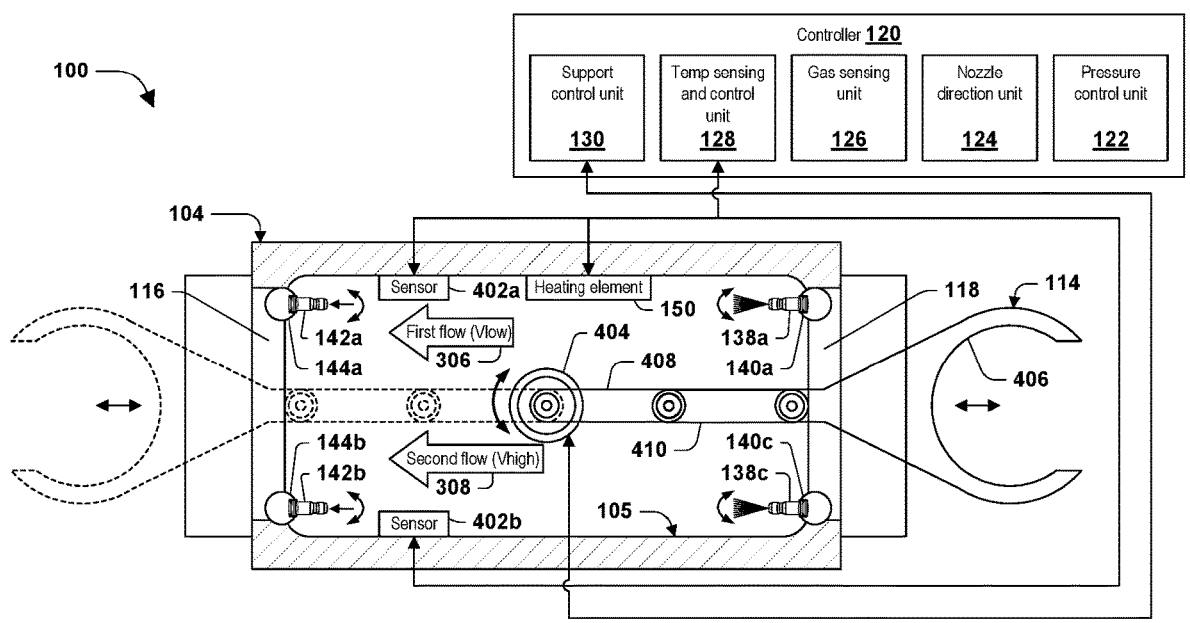

FIGS. 4A-4C are schematic illustrations of the wafer transfer system 100 for transferring a wafer, according to some embodiments. FIG. 4A is a side view illustrating the wafer support 114 in a retracted position, FIG. 4B is a plan view illustrating the wafer support 114 in the retracted position, and FIG. 4C is a plan view illustrating the wafer support 114 in an extended position. The temperature sensing and control unit 128 communicates with a first temperature sensor 402a and/or a second temperature sensor 402b, disposed within the transfer chamber 105. The first temperature sensor 402a and/or the second temperature sensor 402b measure at least one of a temperature of gas within the transfer chamber 105 or a temperature of the wafer 108. In an example, the first temperature sensor 402a and/or the second temperature sensor 402b includes a resistance thermometer (RTD) and/or a thermocouple. A thermocouple may be configured as a plurality of conductors enclosed within a mineral insulated cable. The mineral may be a highly compressed powder made of a metal oxide (e.g., magnesium oxide (MgO) and/or aluminum oxide ($Al_2O_3$)). According to an embodiment, the first temperature sensor 402a and/or the second temperature sensor 402b may be the same as the first pressure sensor 316a and/or the second pressure sensor 316b and calibrated to respond to temperature and pressure. The temperature sensing and control unit 128 then responds to the measured temperature to control the heating element 150 to increase temperature within the transfer chamber 105. The temperature sensing and control unit 128 may respond to the measured temperature and decrease the temperature within the transfer chamber 105. The temperature sensing and control unit 128 communicates with the pressure control unit 122 to increase the first flow of gas 306 and the second flow of gas 308 input into the transfer chamber 105 and/or to increase suction of gas from the transfer chamber 105 by the exhaust pump 148. Other arrangements and/or configurations of the temperature sensing and control unit 128, the first temperature sensor 402a, and/or the second temperature sensor 402b are within the scope of the present disclosure.

According to some embodiments, the nozzle direction unit 124 of the controller 120 communicates with the input nozzle assemblies 140a-d to control a direction of gas input by corresponding input gas nozzles 138a-d into the transfer chamber 105. The nozzle direction unit 124 communicates with the output nozzle assemblies 144a-d to control a direction of gas output by corresponding output gas nozzles 142a-d from the transfer chamber 105. By controlling the input nozzle assemblies 140a-d and/or the output nozzle assemblies 144a-d, the nozzle direction unit 124 controls a direction of gas flow within the transfer chamber 105. The nozzle direction unit 124 controls a first direction, such as about the Y-axis, of one or a plurality of the input gas nozzles 138a-d about a first axis of rotation to control a direction of gas flow within the transfer chamber. For example, the nozzle direction unit 124 controls the first direction of the first input gas nozzle 138a and the third input gas nozzle 138c to control a direction of the first flow of gas 306 within the transfer chamber 105. The nozzle direction unit 124 controls the first direction of the second input gas nozzle 138b and the fourth input gas nozzle 138d to control a direction of the second flow of gas 308 within the transfer chamber 105. In an example, the first input gas nozzle 138a and the third input gas nozzle 138c are controlled to provide a first degree of change in the first direction, such as 15, 30, 45, −15, −30, −45 degrees, etc. The second input gas nozzle 138b and the fourth input gas nozzle 138d are controlled to provide a second degree of change in the first direction, such as 15, 30, 45, −15, −30, −45 degrees, etc. According to an example, the first degree of change is approximately equal to the second degree of change. According to an example, the first degree of change is approximately opposite to the second degree of change. The first degree of change may be a positive degree of change, such as 15, 30, 45, etc., and the second degree of change may be a negative degree of change, such as −15, −30, −45, etc. In some embodiments, the nozzle direction unit 124 controls a second direction, such as about the X-axis, of one or a plurality of the input gas nozzles 138a-d about a second axis of rotation to control a direction of gas flow within the transfer chamber.

According to some embodiments, the nozzle direction unit 124 dynamically controls the first direction, such as about the Y-axis, of one or a plurality of the input gas nozzles 138a-d. For example, the nozzle direction unit 124 dynamically controls the first direction of the first input gas nozzle 138a and the third input gas nozzle 138c to dynamically change about the first degree of change in the first direction, such as 15, 30, 45, −15, −30, −45 degrees, etc. The nozzle direction unit 124 dynamically controls the second input gas nozzle 138b and the fourth input gas nozzle 138d to dynamically change about the second degree of change in the first direction, such as 15, 30, 45, −15, −30, −45 degrees, etc. According to an example, the first degree of dynamic change is approximately equal to the second degree of dynamic change such that all input gas nozzles 138*a-d* cycle in synchronism. According to an example, the first degree of dynamic change is approximately opposite to the second degree of dynamic change such that the first input gas nozzle 138*a* and the third input gas nozzle 138*c* cycle in synchronism with each other and the second input gas nozzle 138*b* and the fourth input gas nozzle 138*d* cycle in synchronism with each other and opposite to the first input gas nozzle 138*a* and the third input gas nozzle 138*c*. In some embodiments, the nozzle direction unit 124 dynamically controls a second direction, such as about the X-axis, of one or a plurality of the input gas nozzles 138*a-d* to control a direction of gas flow within the transfer chamber.

According to some embodiments, the nozzle direction unit 124 controls the output nozzle assemblies 144*a-d* in the first direction, such as about the Y-axis, and/or the second direction, such as about the X-axis, to thereby control the first direction and the second direction of the output gas nozzles 142*a-d* in like manner to the input gas nozzles 138*a-d* set forth above. In an example, the nozzle direction unit 124 controls the first direction of the first input gas nozzle 138*a* and the third input gas nozzle 138*c* to be approximately equal to the direction of the first output gas nozzle 142*a* and the third output gas nozzle 142*c*. In an example, the first direction of the first input gas nozzle 138*a* and the third input gas nozzle 138*c* is approximately opposite to the direction of the first output gas nozzle 142*a* and the third output gas nozzle 142*c*. Input gas nozzles 138*b*, 138*d* and output gas nozzles 142*b*, 142*d* may be controlled in like manner to input gas nozzles 138*a*, 138*c* and output gas nozzles 142*a*, 142*d*.

According to some embodiments, the nozzle direction unit 124 controls the input gas nozzles 138*a-d* and the output gas nozzles 142*a-d* to dynamically change in the first direction, such a about the Y-axis, and/or the second direction, such as about the X-axis. In an example, the input gas nozzles 138*a-d* and the output gas nozzles 142*a-d* cycle in synchronism in at least one of the first direction, the second direction, or the first and the second direction. In an example, the input gas nozzles 138*a*, 138*c* and the output gas nozzles 142*a*, 142*c* cycle in synchronism in at least one of the first direction, the second direction, or the first and the second direction, while the input gas nozzles 138*b*, 138*d* and the output gas nozzles 142*b*, 142*d* cycle in synchronism in at least one of the first direction, the second direction, or the first and the second direction. Other arrangements and/or configurations for controlling the input gas nozzles 138*a-d* and/or the output gas nozzles 142*a-d* are within the scope of the present disclosure.

According to some embodiments, the support control unit 130 controls the wafer support 114 to robotically transfer the wafer 108 into and/or out of the transfer chamber 105. With reference to the plan view of FIG. 4B, the wafer support 114 is illustrated in the retracted position. The wafer support includes a spindle 404 mechanically connected to a receiver 406 by a first linkage 408 and a second linkage 410. As the spindle 404 rotates, the first linkage 408 and the second linkage 410 translate the rotational motion of the spindle 404 into linear motion of the receiver 406. In an example, the wafer 108 may be manually placed onto the receiver 406. With reference to the plan view of FIG. 4C, the receiver 406 may be controlled to traverse through the first load port 116 or the second load port 118 to load the wafer 108 into processing equipment, such as the stage 106 within the processing chamber 102. Other arrangements and/or configurations of the support control unit 130 and/or the wafer support 114 are within the scope of the present disclosure.

Figure 5A:
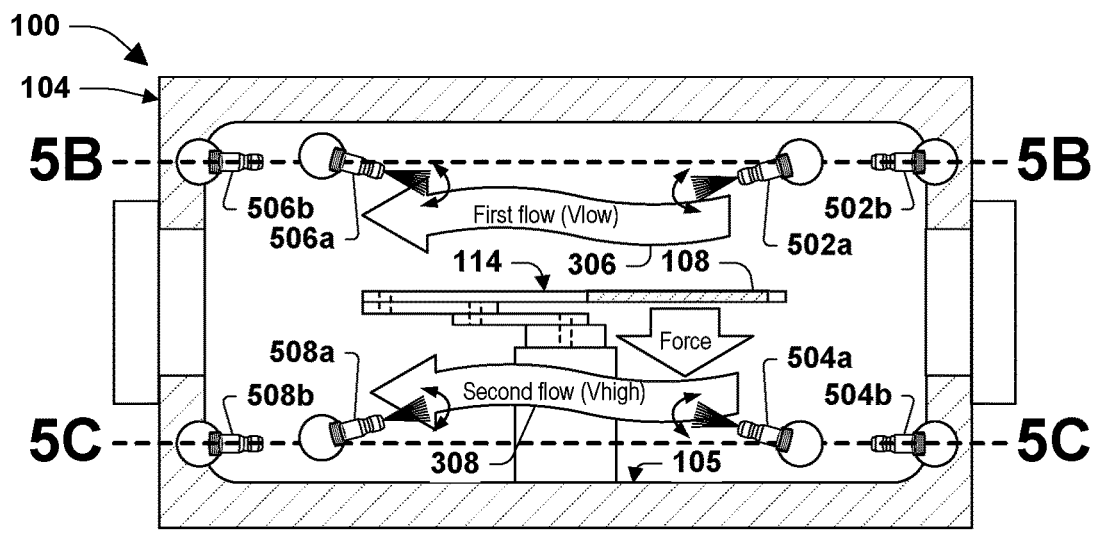
FIGS. 5A-5C are schematic illustrations of a wafer transfer system for transferring a wafer, according to some embodiments.
Figure 5B:
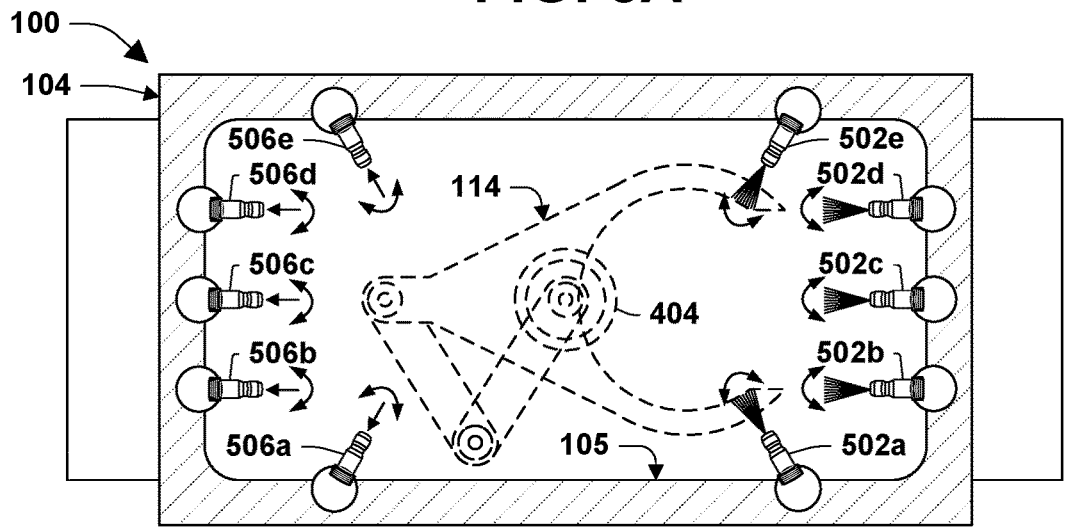
Figure 5C:
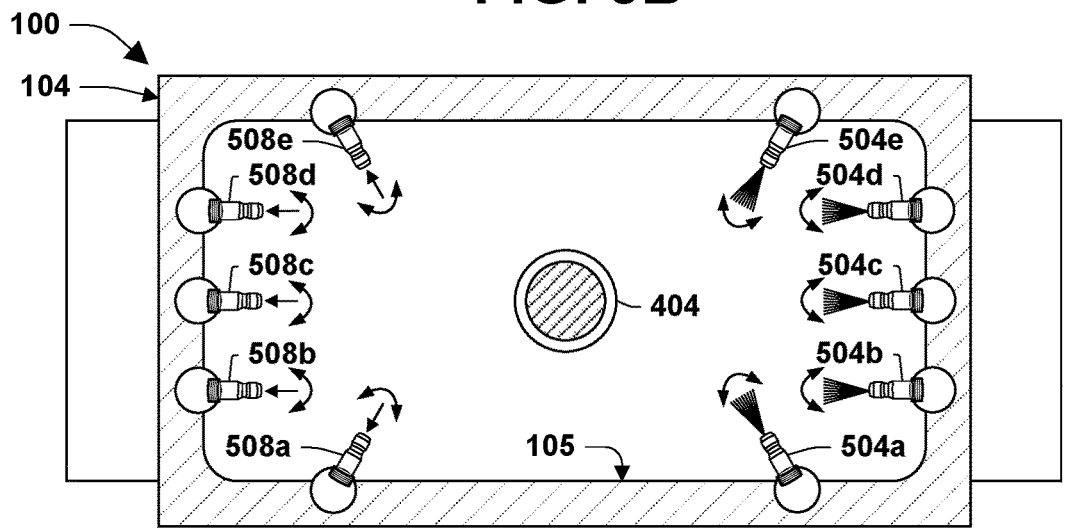

FIGS. 5A-5C are schematic illustrations of the wafer transfer system 100 for transferring a wafer, according to some embodiments. FIG. 5A is a side view of the load lock module 104, FIG. 5B is a plan view taken along line 5B-5B of FIG. 5A, and FIG. 5C is a plan view taken along line 5C-5C of FIG. 5A. A first plurality of input gas nozzles 502*a-e* are disposed above the wafer support 114 and a second plurality of input gas nozzles 504*a-e* are disposed below the wafer support 114. A first plurality of output gas nozzles 506*a-e* are disposed above the wafer support 114 and a second plurality of output gas nozzles 508*a-e* are disposed below the wafer support 114. Each of the first plurality of input gas nozzles 502*a-e* and the second plurality of input gas nozzles 504*a-e* are moveable about the first direction and/or the second direction by corresponding input nozzle assemblies, such as controlled by the nozzle direction unit 124, and are supplied with gas by corresponding input nozzle valves (not shown), such as controlled by the pressure control unit 122. Likewise, each of the first plurality of output gas nozzles 506*a-e* and the second plurality of output gas nozzles 508*a-e* are moveable about the first direction and/or the second direction by corresponding output nozzle assemblies, such as controlled by the nozzle direction unit 124, and are supplied with gas by corresponding output nozzle valves (not shown), such as controlled by the pressure control unit 122.

According to some embodiments, a first set of input gas nozzles and a second set of input gas nozzles are defined from the first plurality of input gas nozzles 502*a-e* and the second plurality of input gas nozzles 504*a-e*. For example, the first set of input gas nozzles may include input gas nozzles 502*c*, 504*c* and the second set of input gas nozzles may include input gas nozzles 502*b*, 502*d*, 504*b*, 504*d*. According to some embodiments, a first set of output gas nozzles and a second set of output gas nozzles are defined from the first plurality of output gas nozzles 506*a-e* and the second plurality of output gas nozzles 508*a-e*. For example, the first set of output gas nozzles may include output gas nozzles 506*c*, 508*c* and the second set of output gas nozzles may include output gas nozzles 506*b*, 506*d*, 508*b*, 508*d*. According to some embodiments, the first set of input gas nozzles and the first set of output gas nozzles are controlled by the pressure control unit 122 to regulate the transfer chamber pressure. According to some embodiments, the second set of input gas nozzles and the second set of output gas nozzles are controlled by the pressure control unit 122 to generate at least one of the first flow of gas 306 and/or the second flow of gas 308.

According to some embodiments, the first set of the input gas nozzles and a first set of the output gas nozzles are controlled in like manner to the input gas nozzles 138*a-d* and the output gas nozzles 142*a-d* set forth above. For example, the first set of the input gas nozzles are positioned about at least one of the first direction, such as about the Y-axis, or the second direction, such as about the X-axis, to coincide with the first set of the output gas nozzles. In an example, the first set of the input gas nozzles are positioned about at least one of the first direction or the second direction opposite to the first set of the output gas nozzles. In an example, the first set of the input gas nozzles are controlled to dynamically change about at least one of the first direction or the second direction in synchronism with controlled dynamic change of the first set of the output gas nozzles about at least one of the first direction or the second direction. In an example, the first set of the input gas nozzles are controlled to dynamically change about at least one of the first direction or the second direction in synchronism with and opposite to controlled dynamic change of the first set of the output gas nozzles about at least one of the first direction or the second direction.

According to some embodiments, the second set of the input gas nozzles and a second set of the output gas nozzles are controlled in like manner to the input gas nozzles 138a-d and the output gas nozzles 142a-d set forth above. For example, the second set of the input gas nozzles are positioned about at least one of the first direction, such as about the Y-axis, or the second direction, such as about the X-axis, to coincide with the second set of the output gas nozzles. In an example, the second set of the input gas nozzles are positioned about at least one of the first direction or the second direction opposite to the second set of the output gas nozzles. In an example, the second set of the input gas nozzles are controlled to dynamically change about at least one of the first direction or the second direction in synchronism with controlled dynamic change of the second set of the output gas nozzles about at least one of the first direction or the second direction. In an example, the second set of the input gas nozzles are controlled to dynamically change about at least one of the first direction or the second direction in synchronism with and opposite to controlled dynamic change of the second set of the output gas nozzles about at least one of the first direction or the second direction.

According to some embodiments, the first plurality of input gas nozzles 502a-e are positioned about at least one of the first direction, such as about the Y-axis, or the second direction, such as about the X-axis, to coincide with the first plurality of output gas nozzles 506a-e. In some embodiments, the first plurality of input gas nozzles 502a-e are positioned about at least one of the first direction or the second direction to be opposite to the first plurality of output gas nozzles 506a-e. In some embodiments, the first plurality of input gas nozzles 502a-e are controlled to dynamically change about at least one of the first direction or the second direction in synchronism with controlled dynamic change of the second plurality of input gas nozzles 504a-e. In some embodiments, the first plurality of input gas nozzles 502a-e are controlled to dynamically change about at least one of the first direction or the second direction in synchronism with and opposite to controlled dynamic change of the second plurality of input gas nozzles 504a-e. In some embodiments, the first plurality of output gas nozzles 506a-e and the second plurality of output gas nozzles 508a-e are controlled in like manner to the first plurality of input gas nozzles 502a-e and the second plurality of input gas nozzles 504a-e, as set forth above. Other arrangements and/or configurations of the first plurality of input gas nozzles 502a-e, the second plurality of input gas nozzles 504a-e, the first plurality of output gas nozzles 506a-e, and/or the second plurality of output gas nozzles 508a-e are within the scope of the present disclosure.

Figure 6A:
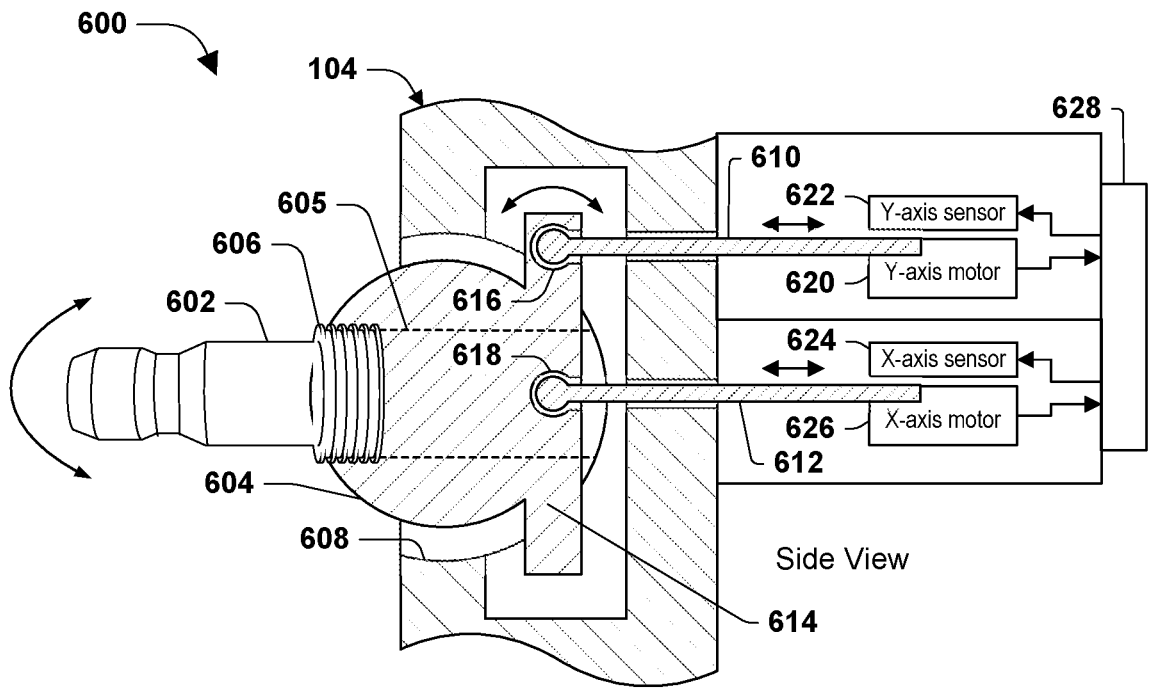
FIGS. 6A-6E are schematic illustrations of a nozzle assembly, according to some embodiments.
Figure 6B:
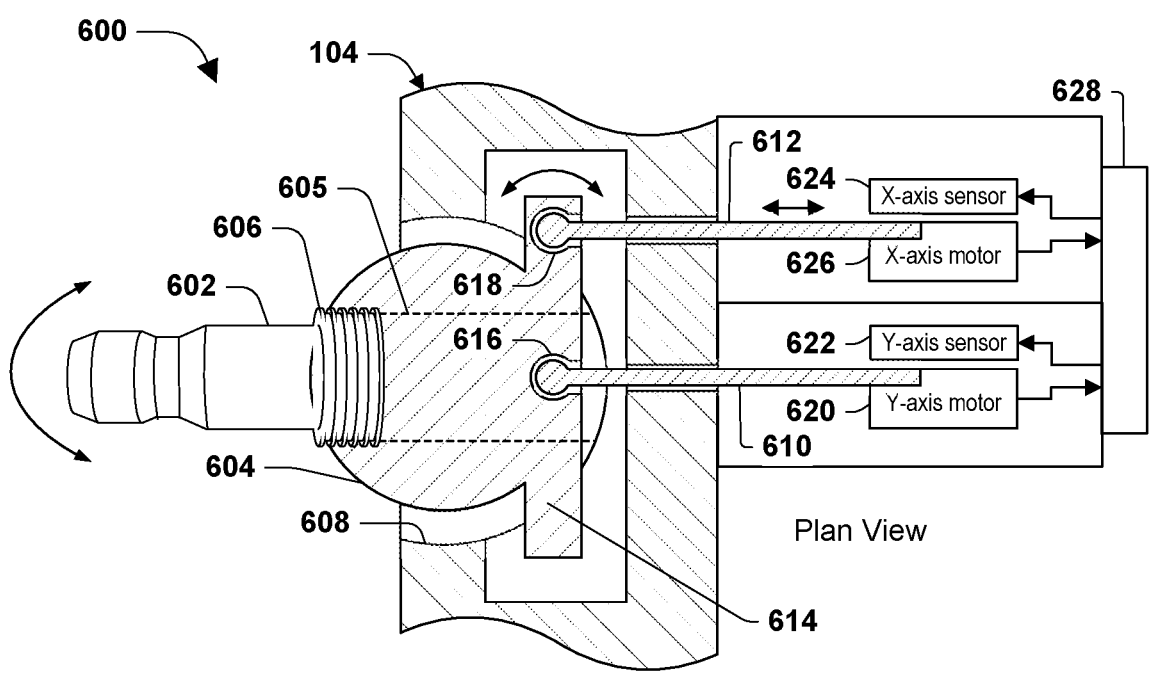
Figure 6C:
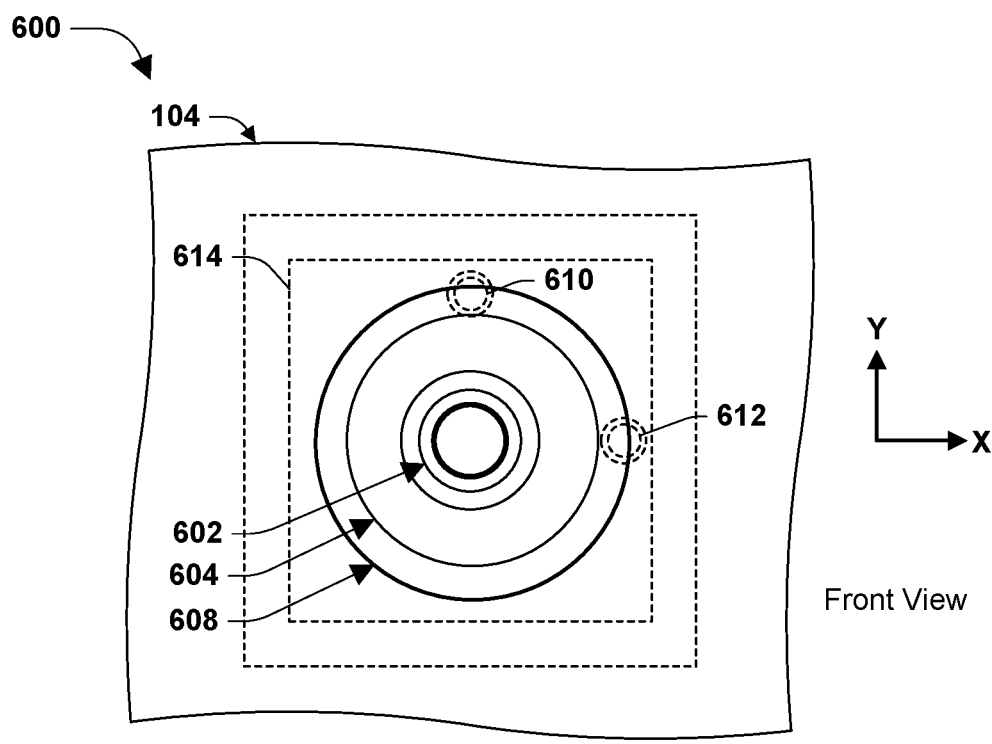
Figure 6D:
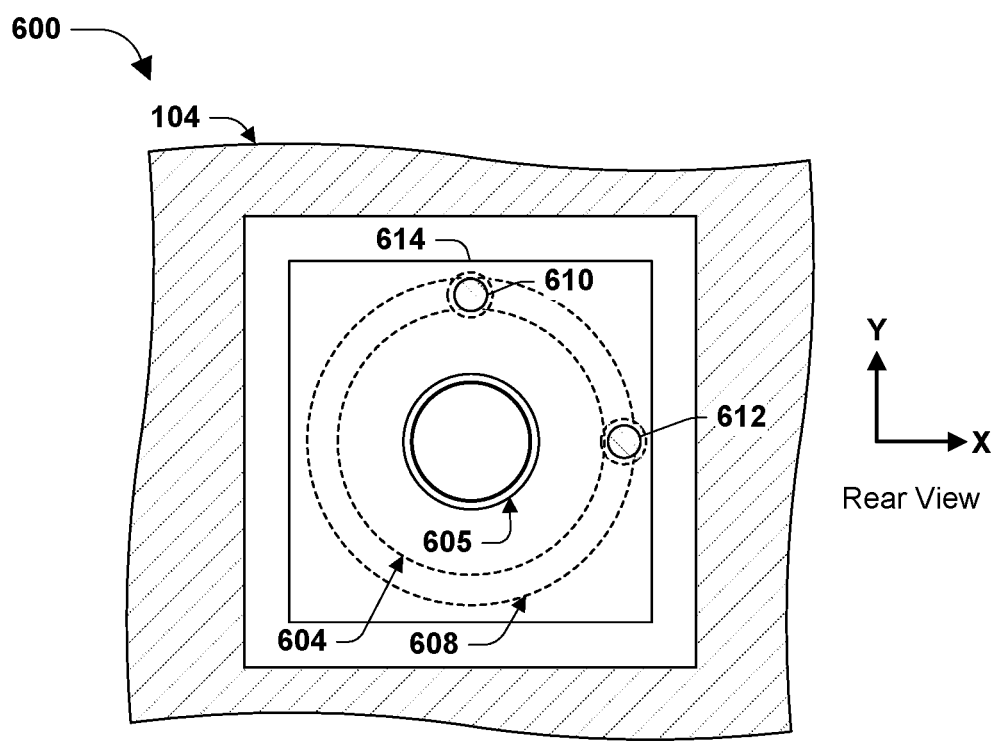
Figure 6E:
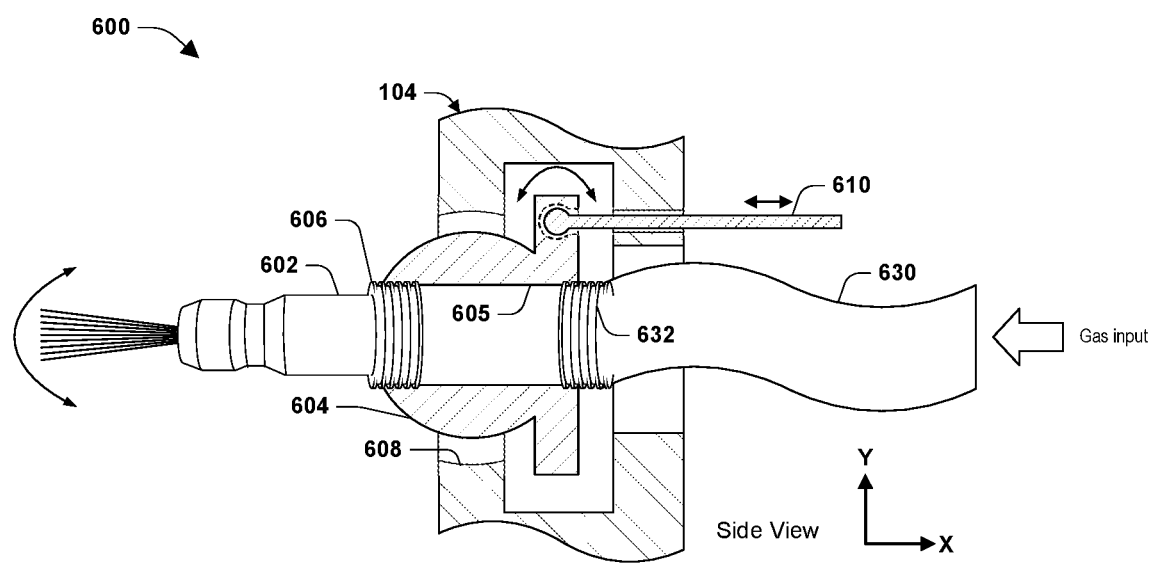

FIGS. 6A-6E are schematic illustrations of a nozzle assembly 600, according to some embodiments. The nozzle assembly 600 is an example nozzle assembly corresponding to any one or more of the above mentioned nozzle assemblies, such as 140a-d, 144a-d, 305. The nozzle assembly 600 is configured to control and/or dynamically control a position of a nozzle, such as 138a-d, 142a-d, 304, 502a-e, 504a-e, 506a-e, 508a-e, about at least one of the first direction, such as about the Y-axis, or the second direction, such as about the X-axis. The nozzle assembly 600 responds to control signals from the nozzle direction unit 124, in some embodiments. FIG. 6A is a side view, FIG. 6B is a plan view, FIG. 6C is a front view, and FIG. 6D is a rear view of the nozzle assembly 600. As illustrated, the nozzle assembly 600 includes a nozzle 602 secured into a ball structure 604 by external threads 606. The ball structure 604 is rotatable about a first axis and/or a second axis. The ball structure 604 defines a channel 605 to pass gas to the nozzle 602. The ball structure 604 moves within a socket 608 about the Y-axis in response to linear motion of a first lever arm 610 and about the X-axis in response to linear motion of a second lever arm 612. The ball structure 604 includes a rear plate 614 defining a first lever socket 616 and a second lever socket 618. A ball end of the first lever arm 610 is received within the first lever socket and a ball end of the second lever arm 612 is received within the second lever socket 618. The first lever arm 610 is moved linearly in response to a Y-axis motor 620 and a position of the first lever arm 610 is determined by a Y-axis sensor 622. Linear motion of the first lever arm 610 translates into rotational movement of the ball structure 604 about the Y-axis. The second lever arm 612 is moved linearly in response to an X-axis motor 624 and a position of the second lever arm 612 is determined by an X-axis sensor 626. Linear motion of the second lever arm 612 translates into rotational movement of the ball structure 604 about the X-axis. The Y-axis motor 620, the Y-axis sensor 622, the X-axis motor 624, and the X-axis sensor 626 communicate with and respond to commands from the nozzle direction unit 124 by way of an interface 628. FIG. 6E is a side view of the nozzle assembly 600 illustrating connection of a conduit 630, such as a pneumatic hose, to rear external threads 632 of the ball structure 604. Other arrangements and/or configurations of the nozzle assembly 600 are within the scope of the present disclosure.

Figure 7:
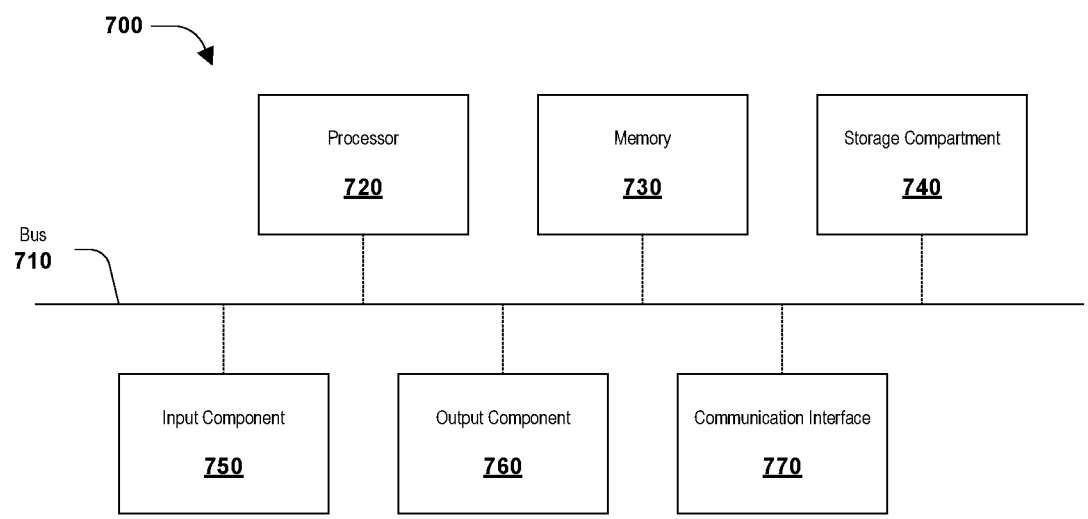
FIG. 7 is a diagram of example components of a device, according to some embodiments.

FIG. 7 is a diagram of example components of a device 700, according to some embodiments. The device 700 may correspond to the controller 120. As illustrated in FIG. 7, the device 700 may include a bus 710, a processor 720, a memory 730, a storage component 740, an input component 750, an output component 760, and a communication interface 770. The bus 710 includes a component that permits communication among the components of the device 700. The processor 720 is implemented in hardware, firmware, or a combination of hardware and software. The processor 720 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 720 includes one or more processors capable of being programmed to perform a function. The memory 730 includes a random access memory (RAM), a read only memory (ROM), and/or another type of dynamic or static storage device (e.g., a flash memory, a magnetic memory, and/or an optical memory) that stores information and/or instructions for use by the processor 720.

The storage component 740 stores information and/or software related to the operation and use of the device 700. For example, the storage component 740 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 750 includes a component that permits the device 700 to receive information, such as via user input (e.g., a touch screen display, a keyboard, a keypad, a mouse, a button, a switch, and/or a microphone). Additionally, or alternatively, the input component 750 may include a sensor for sensing information (e.g., a global positioning system (GPS) component, an accelerometer, a gyroscope, and/or an actuator). The output component 760 includes a component that provides output information from device 700 (e.g., a display, a speaker, and/or one or more light-emitting diodes (LEDs)). The communication interface 770 includes a transceiver-like component (e.g., a transceiver and/or a separate receiver and transmitter) that enables the device 700 to communicate with other devices, such as via a wired connection, a wireless connection, or a combination of wired and wireless connections. The communication interface 770 may permit the device 700 to receive information from another device and/or provide information to another device. For example, the communication interface 770 may include an Ethernet interface, an optical interface, a coaxial interface, an infrared interface, a radio frequency (RF) interface, a universal serial bus (USB) interface, a Wi-Fi interface, a cellular network interface, and/or the like.

The device 700 may perform one or more processes described herein. The device 700 may perform these processes based on the processor 720 executing software instructions stored by a non-transitory computer-readable medium, such as the memory 730 and/or the storage component 740. A computer-readable medium is defined herein as a non-transitory memory device. A memory device includes memory space within a single physical storage device or memory space spread across multiple physical storage devices. Software instructions may be read into the memory 730 and/or the storage component 740 from another computer-readable medium or from another device via the communication interface 770. When executed, software instructions stored in the memory 730 and/or the storage component 740 may cause the processor 720 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 7 are provided as an example. In practice, the device 700 may include additional components, fewer components, different components, or differently arranged components than those shown in FIG. 7. Additionally, or alternatively, a set of components (e.g., one or more components) of device 700 may perform one or more functions described as being performed by another set of components of the device 700.

Figure 8:
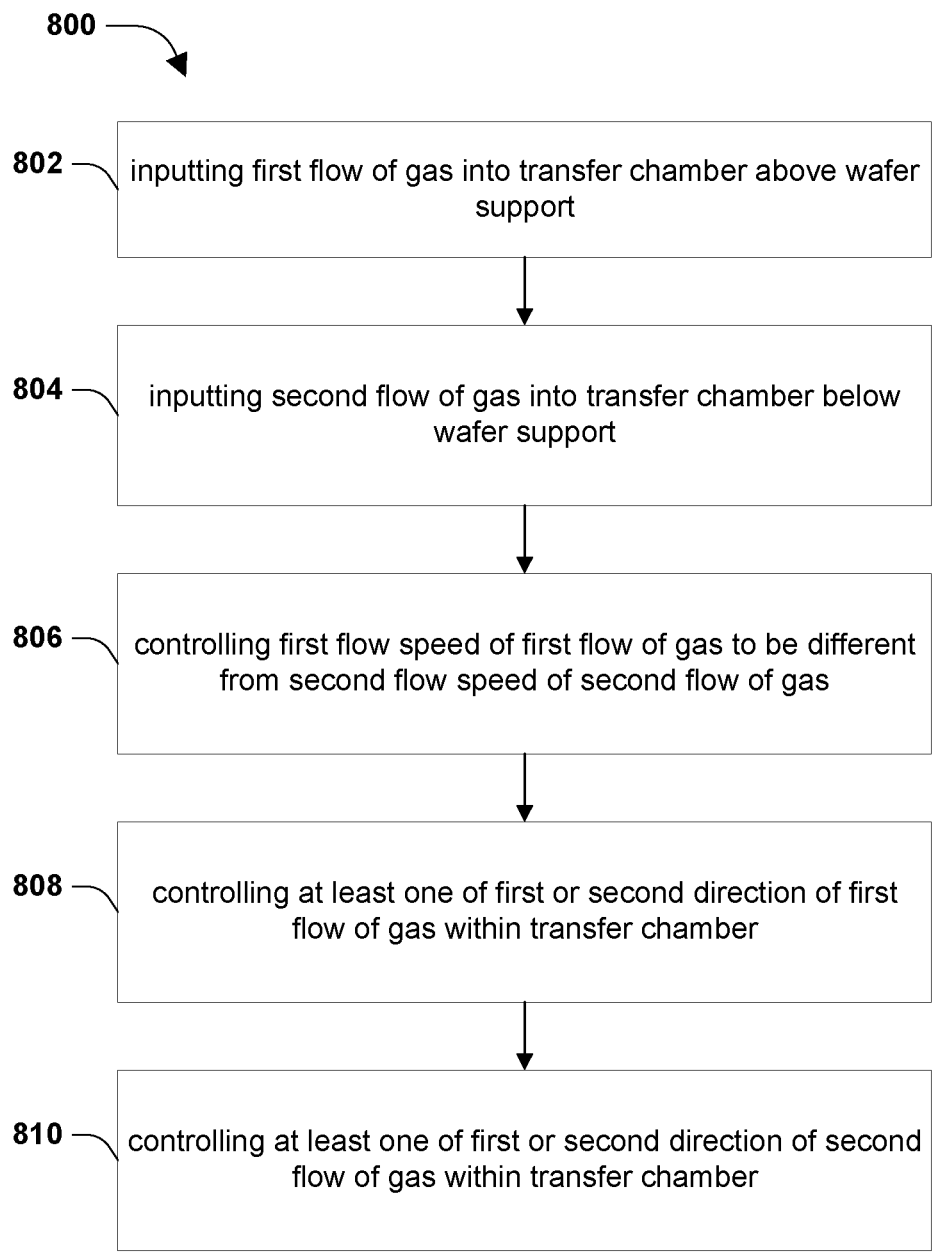
FIG. 8 illustrates an example method, in accordance with some embodiments.

FIG. 8 illustrates an example method 800, in accordance with some embodiments. Some of the operations described can be replaced and/or eliminated for different embodiments. At 802, a first flow of gas is input into a transfer chamber above a wafer support. The first flow of gas is at least one of the first flow of gas 306 or other flow of gas. The transfer chamber is at least one of the transfer chamber 105 or other suitable transfer chamber and the wafer support is at least one of the wafer support 114 or other suitable structure. At 804, a second flow of gas is input into the transfer chamber below the wafer support. The second flow of gas is at least one of the second flow of gas 308 or other flow of gas. At 806, a first flow speed of the first flow of gas is controlled to be different than a second flow speed of a second flow of gas. At 808, at least one of a first or a second direction of the first flow of gas is controlled within the transfer chamber. The first direction is at least one of a direction with respect to a Y-axis or other suitable axis and the second direction is at least one of a direction with respect to an X-axis or other suitable axis. At 810, at least one of a first or a second direction of a second flow of gas is controlled within transfer chamber.

According to some embodiments, a wafer transfer system is provided. The wafer transfer system includes a transfer chamber defining a volume and the transfer chamber includes a wafer support within the volume to support a wafer. A first input gas nozzle is disposed above the wafer support within the transfer chamber and inputs a first flow of gas into the transfer chamber at a first flow speed. A second input gas nozzle is disposed below the wafer support within the transfer chamber and inputs a second flow of gas into the transfer chamber at a second flow speed different than the first flow speed. A first output gas structure guides the gas from the transfer chamber due to the second flow speed being different than the first flow speed such that suspended particles within the transfer chamber are at least one of directed away from the wafer support or directed toward the first output gas structure to guide the suspended particles from the transfer chamber.

According to some embodiments, a method of shielding in a wafer transport system is provided. The method includes inputting, by a first input gas nozzle, a first flow of gas into a transfer chamber including a wafer support to support a wafer, above the wafer support. The method includes inputting, by a second input gas nozzle, a second flow of gas into the transfer chamber below the wafer support. The method includes supplying, by a gas supply unit, gas to the first input gas nozzle and the second input gas nozzle. The method includes controlling, by a controller, at least one of a first flow speed of the first flow of gas input into the transfer chamber or a second flow speed of the gas supplied by the gas supply unit to the first input gas nozzle. The method includes controlling, by the controller at least one of a third flow speed of the second flow of gas input into the transfer chamber different than the first flow speed or a fourth flow speed of the gas supplied by the gas supply unit to the second input gas nozzle different than the second flow speed.

According to some embodiments, a method of shielding in a wafer transport system is provided. The method includes inputting, by a first input gas nozzle, a first flow of gas into a transfer chamber comprising a wafer support to support a wafer, above the wafer support. The method includes inputting, by a second input gas nozzle, a second flow of gas into the transfer chamber below the wafer support. The method includes controlling, by a controller, at least one of a first direction of the first flow of gas input into the transfer chamber or a second direction of the second flow of gas input into the transfer chamber such that suspended particles within the transfer chamber are at least one of directed away from the wafer support or directed toward a first output gas structure to guide the suspended particles from the transfer chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A wafer transfer system, comprising:
    a transfer chamber defining a volume, the transfer chamber comprising a wafer support within the volume to support a wafer;
    a first set of gas nozzles, comprising:
        a first input gas nozzle, disposed above the wafer support within the transfer chamber, to input a first flow of a first gas into the transfer chamber at a first flow speed;
        a first output gas nozzle disposed above the wafer support within the transfer chamber to guide at least one of the first gas, a second gas, a third gas, or a fourth gas from the transfer chamber;
        a second input gas nozzle to input a second flow of the second gas into the transfer chamber; and
        a second output gas nozzle to guide at least one of the first gas, the second gas, the third gas, or the fourth gas from the transfer chamber; and
    a second set of gas nozzles, comprising:
        a third input gas nozzle, disposed below the wafer support within the transfer chamber, to input a third flow of the third gas into the transfer chamber at a second flow speed different than the first flow speed; and
        a fourth input gas nozzle to input a fourth flow of the fourth gas into the transfer chamber;
        a first output gas structure to guide at least one of the first gas, the second gas, the third gas, or the fourth gas from the transfer chamber due to the second flow speed being different than the first flow speed such that suspended particles within the transfer chamber are at least one of directed away from the wafer support or directed toward the first output gas structure to guide the suspended particles from the transfer chamber, wherein the first output gas structure is configured as a third output gas nozzle; and
        a fourth output gas nozzle to guide at least one of the first gas, the second gas, the third gas, or the fourth gas from the transfer chamber.

2. The wafer transfer system according to claim 1, wherein the first flow speed of the first flow of the first gas input into the transfer chamber by the first input gas nozzle is less than the second flow speed of the third flow of the third gas input into the transfer chamber by the third input gas nozzle.

3. The wafer transfer system according to claim 1, comprising:
    a controller to control at least one of the first flow speed of the first flow of the first gas input into the transfer chamber by the first input gas nozzle or the second flow speed of the third flow of the third gas input into the transfer chamber by the third input gas nozzle.

4. The wafer transfer system according to claim 3, wherein the controller controls the first flow speed of the first flow of the first gas input into the transfer chamber by the first input gas nozzle to be less than the second flow speed of the third flow of the third gas input into the transfer chamber by the third input gas nozzle to create a pressure within the transfer chamber below the wafer support that is lower than a pressure within the transfer chamber above the wafer support.

5. The wafer transfer system according to claim 1, comprising:
a controller to control a first direction of the first input gas nozzle about a first axis of rotation to control a direction of gas flow within the transfer chamber.

6. The wafer transfer system according to claim 5, wherein the controller controls a second direction of the first input gas nozzle about a second axis of rotation to control the direction of gas flow within the transfer chamber.

7. The wafer transfer system according to claim 6, wherein the controller controls at least one of the first direction of the first input gas nozzle to dynamically change about the first axis of rotation or the second direction of the first input gas nozzle to dynamically change about the second axis of rotation to dynamically control the direction of gas flow within the transfer chamber.

8. The wafer transfer system according to claim 5, wherein:
the first output gas structure is disposed below the wafer support, and
the controller controls the first direction of the first input gas nozzle dynamically about the first axis of rotation, a second direction of the first output gas nozzle dynamically about a second axis of rotation, a third direction of the third-second input gas nozzle dynamically about a third axis of rotation, and a fourth direction of the third output gas nozzle dynamically about a fourth axis of rotation to dynamically control the direction of gas flow within the transfer chamber.

9. A wafer transfer system, comprising:
a transfer chamber forming a volume, the transfer chamber comprising a wafer support within the volume to support a wafer;
a first input gas nozzle, disposed above the wafer support within the transfer chamber, to input a first flow of a first gas into the transfer chamber at a first flow speed;
a second input gas nozzle, disposed below the wafer support within the transfer chamber, to input a second flow of a second gas into the transfer chamber at a second flow speed different than the first flow speed;
a first output gas structure to guide at least one of the first gas or the second gas from the transfer chamber due to the second flow speed being different from the first flow speed such that suspended particles within the transfer chamber are at least one of directed away from the wafer support or directed toward the first output gas structure to guide the suspended particles from the transfer chamber; and
a controller to control a first direction of the first input gas nozzle about a first axis of rotation to control a direction of gas flow within the transfer chamber and to control a second direction of the first input gas nozzle about a second axis of rotation to control the direction of gas flow within the transfer chamber.

10. The wafer transfer system according to claim 9, wherein the first flow speed of the first flow of the first gas input into the transfer chamber by the first input gas nozzle is less than the second flow speed of the second flow of the second gas input into the transfer chamber by the second input gas nozzle.

11. The wafer transfer system according to claim 9, comprising:
a first output gas nozzle disposed above the wafer support within the transfer chamber to guide at least one of the first gas or the second gas from the transfer chamber.

12. The wafer transfer system according to claim 11, comprising:
a first set of gas nozzles, comprising the first input gas nozzle and the first output gas nozzle; and
a second set of gas nozzles, comprising the second input gas nozzle and the first output gas structure configured as a second output gas nozzle.

13. The wafer transfer system according to claim 9, wherein the controller controls at least one of the first flow speed of the first flow of the first gas input into the transfer chamber by the first input gas nozzle or the second flow speed of the second flow of the second gas input into the transfer chamber by the second input gas nozzle.

14. The wafer transfer system according to claim 13, wherein the controller controls the first flow speed of the first flow of the first gas input into the transfer chamber by the first input gas nozzle to be less than the second flow speed of the second flow of the second gas input into the transfer chamber by the second input gas nozzle to create a pressure within the transfer chamber below the wafer support that is lower than a pressure within the transfer chamber above the wafer support.

15. The wafer transfer system according to claim 9, wherein the controller controls at least one of the first direction of the first input gas nozzle to dynamically change about the first axis of rotation or the second direction of the first input gas nozzle to dynamically change about the second axis of rotation to dynamically control the direction of gas flow within the transfer chamber.

16. The wafer transfer system according to claim 9, comprising:
a first set of gas nozzles, comprising the first input gas nozzle and a first output gas nozzle, disposed above the wafer support; and
a second set of gas nozzles, comprising the second input gas nozzle and the first output gas structure configured as a second output gas nozzle disposed below the wafer support,
wherein the controller controls the first direction of the first input gas nozzle dynamically about the first axis of rotation, a third direction of the first output gas nozzle dynamically about a third axis of rotation, a fourth direction of the second input gas nozzle dynamically about a fourth axis of rotation, and a fifth direction of the second output gas nozzle dynamically about a fifth axis of rotation to dynamically control the direction of gas flow within the transfer chamber.

17. A wafer transfer system, comprising:
a transfer chamber defining a volume, the transfer chamber comprising a wafer support within the volume to support a wafer;
a first set of gas nozzles, comprising:
a first input gas nozzle, disposed above the wafer support within the transfer chamber, to input a first flow of a first gas into the transfer chamber at a first flow speed; and
a first output gas nozzle disposed above the wafer support;
a second set of gas nozzles, comprising:
a second input gas nozzle, disposed below the wafer support within the transfer chamber, to input a second flow of a second gas into the transfer chamber at a second flow speed different than the first flow speed; and
a first output gas structure to guide at least one of the first gas or the second gas from the transfer chamber due to the second flow speed being different than the first flow speed such that suspended particles within the transfer chamber are at least one of directed away from the wafer support or directed toward the first output gas structure to guide the suspended particles from the transfer chamber, wherein the first output gas structure is configured as a second output gas nozzle disposed below the wafer support; and a controller to control a first direction of the first input gas nozzle dynamically about a first axis of rotation, a second direction of the first output gas nozzle dynamically about a second axis of rotation, a third direction of the second input gas nozzle dynamically about a third axis of rotation, and a fourth direction of the second output gas nozzle dynamically about a fourth axis of rotation to dynamically control a direction of gas flow within the transfer chamber.

18. The wafer transfer system according to claim 17, wherein the first flow speed of the first flow of the first gas input into the transfer chamber by the first input gas nozzle is less than the second flow speed of the second flow of the second gas input into the transfer chamber by the second input gas nozzle.

19. The wafer transfer system according to claim 17, wherein the controller controls at least one of the first flow speed of the first flow of the first gas input into the transfer chamber by the first input gas nozzle or the second flow speed of the second flow of the second gas input into the transfer chamber by the second input gas nozzle.

20. The wafer transfer system according to claim 19, wherein the controller controls the first flow speed of the first flow of the first gas input into the transfer chamber by the first input gas nozzle to be less than the second flow speed of the second flow of the second gas input into the transfer chamber by the second input gas nozzle to create a pressure within the transfer chamber below the wafer support that is lower than a pressure within the transfer chamber above the wafer support.

\* \* \* \* \*